United States Patent
Rathmell et al.

(10) Patent No.: US 7,112,809 B2
(45) Date of Patent: *Sep. 26, 2006

(54) ELECTROSTATIC LENS FOR ION BEAMS

(75) Inventors: Robert D. Rathmell, Murphy, TX (US); Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/894,209

(22) Filed: Jul. 19, 2004

(65) Prior Publication Data

US 2004/0262542 A1 Dec. 30, 2004

Related U.S. Application Data

(63) Continuation-in-part of application No. 10/607,239, filed on Jun. 26, 2003, now Pat. No. 6,774,377.

(51) Int. Cl.
*H01J 37/317* (2006.01)

(52) U.S. Cl. ............................. 250/492.21; 250/396 R

(58) Field of Classification Search ........... 250/492.21, 250/396 R
See application file for complete search history.

(56) References Cited

U.S. PATENT DOCUMENTS

| | | | |
|---|---|---|---|
| 5,091,655 A | 2/1992 | Dykstra et al. | |
| 5,177,366 A * | 1/1993 | King et al. | 250/492.2 |
| 5,780,863 A | 7/1998 | Benveniste et al. | |
| 6,774,377 B1 * | 8/2004 | Rathmell et al. | 250/492.21 |
| 6,777,696 B1 | 8/2004 | Rathmell et al. | |

FOREIGN PATENT DOCUMENTS

| | | |
|---|---|---|
| EP | 0 501 638 A | 9/1992 |
| EP | 0 631 358 A | 12/1994 |
| JP | 01003950 | 6/1987 |
| JP | 62184754 | 8/1987 |
| WO | WO82/04351 | 12/1982 |

OTHER PUBLICATIONS

N. Nagai, T. Kawai, M. Nogami, T. Shin'yama, T. Yuasa, Y. Kibi, H. Kawakami, K. Nishikawa and M. Isobe *The Nissin NY-20SP Medium-Current Ion Implanter*. Nuclear Instruments and Methods in Physics Research B55 (1991) 393-397 North Holland.

Annex to Form PCT/ISA/206 Communication Relating ot the Results of the Partial International Search from International App No. PCT/US2005/025559.

* cited by examiner

*Primary Examiner*—Kiet T. Nguyen
(74) *Attorney, Agent, or Firm*—Watts Hoffmann CO, LPA

(57) ABSTRACT

A lens structure for use with an ion beam implanter. The lens structure includes first and second electrodes spaced apart along a direction of ion movement. The lens structure extends across a width of the ion beam for deflecting ions entering the lens structure. The lens structure includes a first electrode for decelerating ions and a second electrode for accelerating the ions. A lens structure mode controller selectively activates either the accelerating or decelerating electrode to to cause ions entering the lens structure to exit said lens structure with a desired trajectory regardless of the trajectory ions enter the lens structure.

32 Claims, 4 Drawing Sheets

ELECTROSTATIC LENS FOR ION BEAMS

CROSS-REFERENCE TO RELATED APPLICATIONS

This application is a continuation-in-part of prior U.S. patent application Ser. No. 10/607,239 filed Jun. 26, 2003 now U.S. Pat. No. 6,774,377.

FIELD OF THE INVENTION

The present invention concerns ion beam implanters and more particularly to ion beam implanters having a lens through which ions that make up an ion beam pass to produce a controlled angle of impact between ions and a work-piece.

BACKGROUND ART

Axcelis Technologies, assignee of the present invention, sells products for treatment of silicon wafers during Integrated Circuit fabrication. One such product or tool creates an ion beam that modifies the physical properties of wafers that are placed into the ion beam. This process can be used, for example, to dope the silicon from which the untreated wafer is made to produce a semiconductor material. Controlled use of masking with resist materials prior to ion implantation as well as layering of different dopant patterns within the wafer produce an integrated circuit for use in one of a myriad of applications.

Prior art U.S. Pat. No. 5,177,366 to King et al and U.S. Pat. No. 5,091,655 to Dykstra et al. discuss methods of using two pair of electrostatic scanning electrodes to generate parallel ion beams. The '366 patent concerns an ion beam implantation system wherein an ion beam is controllably deflected from an initial trajectory as it passes through spaced parallel plates that are biased by a control circuit. Once deflected, the ion beam passes through electrodes positioned along a beam travel path that both re-deflect the once-deflected ion beam and accelerate the ions to a desired final energy. Ions within the beam exit the accelerator and impact a work-piece at a uniform, controlled impact angle due to ion focusing in a scanning plane and an orthogonal cross plane.

The '655 patent relates to an ion beam that is controllably deflected from an initial trajectory as it passes through spaced parallel plates that are biased by a control circuit. Once deflected, the ion beam enters an accelerator that both re-deflects the once deflected ion beam and accelerates the ions to a desired final energy. When the beam exits the accelerator it moves along a trajectory that impacts a work-piece. Ions making up the ion beam all impact the work-piece at a uniform, controlled impact angle.

A printed publication entitled "The Nissin NH-20SP medium-current ion implanter" to Nagai et al describes a medium current ion implanter. The implanter has a pair of so-called kickback electrodes H2 that compensate for side to side scanning introduced by an initial set of electrodes. The sweep-voltage waveform applied to the H1 and H2 electrodes is generated by a digital-waveform generator, or a waveform controller.

SUMMARY OF THE INVENTION

An ion implanter includes an ion source for emitting ions generated from a source material and structure for causing ions to exit the source. A scanning electrode scans ions from side to side in a controlled manner to form an ion beam having a width. A lens structure defines a region into which the ions pass to deflect ions away from an initial trajectory downstream from the scanning electrode as they enter the lens structure.

The lens structure includes first and second electrodes spaced apart along a direction of ion movement which extends on opposite sides of a beam path across a width of the ion beam for deflecting ions entering the lens structure. In one embodiment of the lens structure, ions first encounter a first electrode for decelerating ions and then encounter a second electrode for accelerating the ions. The combined action of these electrodes causes ions entering the lens structure to exit the lens structure with approximately the same exit trajectory regardless of the trajectory of the ions as they enter the lens structure. In an alternate construction, the lens structure includes a first electrode along the beam path for accelerating ions and a second electrode downstream from the first electrode for decelerating ions. This alternative embodiment also causes ions entering the lens structure to exit the lens structure with approximately the same exit trajectory regardless of the trajectory of the ions as they enter the lens structure.

Another embodiment features a lens structure in which each electrode in a series of electrodes is controlled such that a subset of the electrodes to be deactivated so that, for example, only one accelerating or one decelerating electrode is acting on the ion beam.

These and other objects, advantages and features of the invention are described in greater detail in conjunction with drawings which are used to describe an exemplary embodiment of the invention.

EXEMPLARY ALTERNATE EMBODIMENTS OF THE INVENTION

Figure 1:
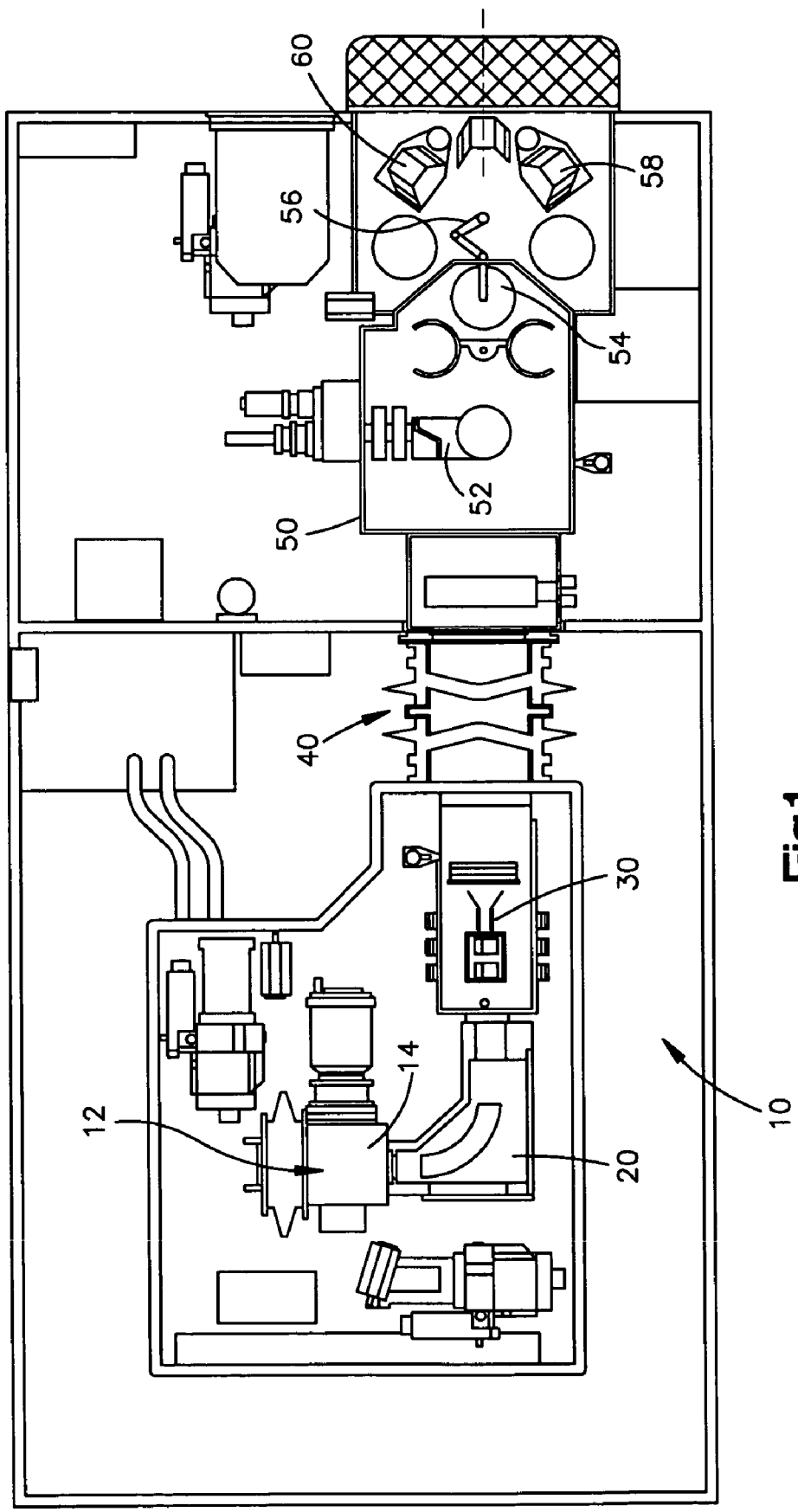
FIG. 1 is an overview schematic of an ion implanter which utilizes the present invention.

FIG. 1 is a schematic depiction of an ion implanter 10 such as Axcelis model MC-3 medium current ion implanter sold by the assignee of the present invention. Such an implanter is used for ion beam treatment of work-pieces such as silicon wafers for selective doping of those wafers. In such an implanter positive ions strike the work-piece after traversing a beam path from a source to an implanter station. Although the ion implanter 10 depicted in FIG. 1 is a medium current ion implanter other types of implanters including high energy implanters having a linac for accelerating ions of an ion beam can utilize the invention.

The ion implanter 10 includes an ion source 12 for emitting ions generated from a source material. Typical source materials are either gases injected into a source housing 14 or solids that are vaporized to produce a plasma of ions within the source housing. As is well known in the prior art such a source 12 typically includes an extraction electrode for causing ions to exit the housing 14 along a beam path away from the source.

The implanter 10 depicted in FIG. 1 also includes a mass discriminating magnet 20 for bending ions away from a trajectory along a path of ion travel downstream from the ion source. Different species of the same ion are produced in the source 12 and the magnet discriminates between theses species. Ions of an undesirable mass are filtered by the magnet so that ions exiting the mass analyzing magnet 20 are of a single species of the ion used in beam treatment of the workpiece.

The ion implanter 10 also includes a beam scanning structure 30 which is positioned to intercept ions subsequent to the mass discriminating magnet 20 and scan ions from side to side in a controlled manner to form an ion beam having a width. The scanning structure 30 can be a scanning electrode as shown or a magnetic scanner. The scanning electrode has two scan plates that are approximately 20 cm long and spaced apart by 2.5 cm. This separation expands outwardly to a separation of about 7.5 cm at an exit end of the two scanning electrodes. Voltages of up to +/−20 kilovolts of a controlled magnitude are applied suitable amplifiers coupled to each plate to achieve a total plate voltage separation of 40 kv.

Figure 2:
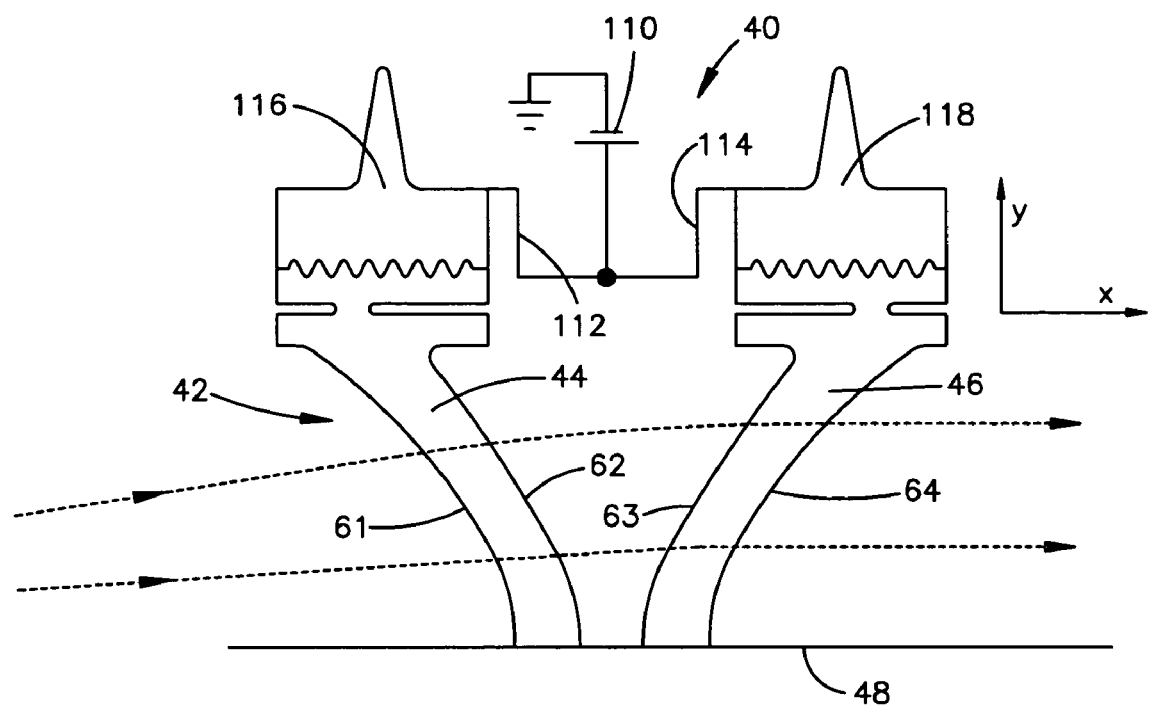
FIG. 2 is a plan view of a lens structure used in an exemplary embodiment of the invention.
Figure 3:
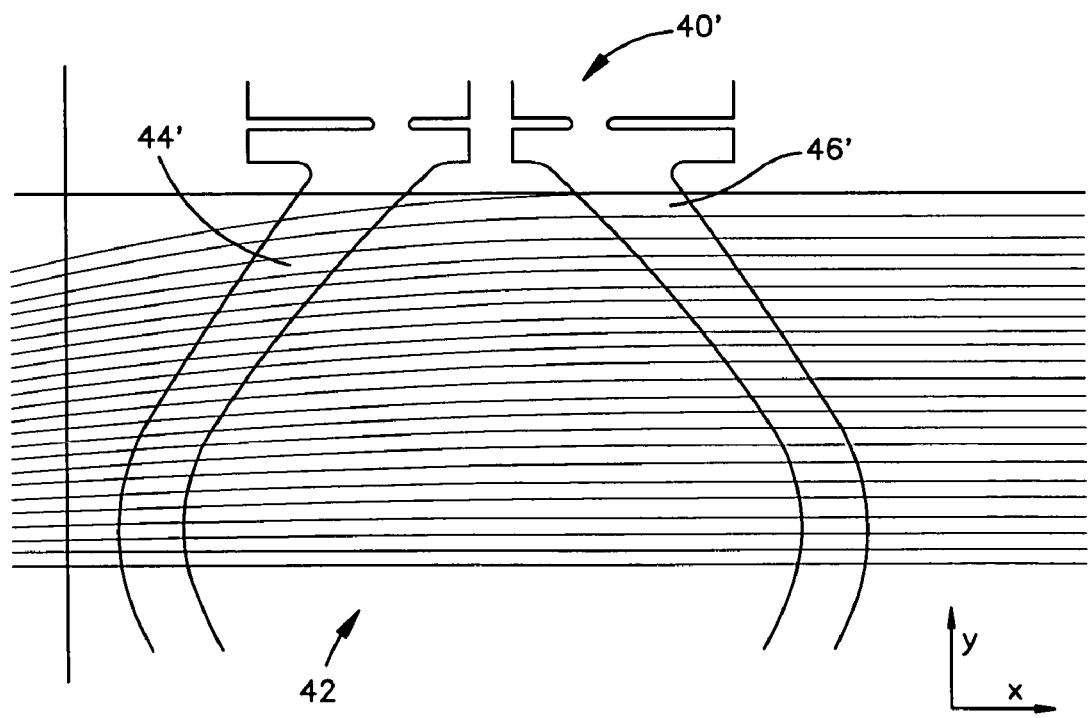
FIG. 3 is a plan view of an alternate lens structure used with an alternate exemplary embodiment of the present invention.

A lens structure 40 shown in greater detail in FIG. 2 is positioned downstream from the two scanning electrodes. The lens structure 40 accepts ions moving along diverging paths and bends them to create parallel ion trajectories for ions leaving the lens structure 40. As seen in FIGS. 2 and 3 the lens structure defines a region 42 into which the ions move after exiting a region of the scanning electrode 30. The electric field set up by the lens structure 40 deflects ions away from an initial trajectory along which the ions move as they enter the lens structure to a final trajectory.

The lens structure 40 of FIG. 2 includes first and second voltage gaps 44, 46 spaced apart along a direction of ion movement. These gaps are formed between electrodes 61 and 62 on the first gap and electrodes 63 and 64 on the second gap. These electrodes have slot-shaped openings that allow the beam to pass through them. Electrodes 62 and 63 are electrically part of the same structure and at the same potential determined by a power supply 110. Electrodes 61 and 64 may be at ground potential. In the exemplary embodiment the electrodes are constructed from aluminum. An x-y coordinate system has been illustrated in FIG. 2 to help in describing the configuration of the lens structure. Each electrode extends in the 'y' direction on opposite sides of a central beam path, 48, across a width of the scanned ion beam. In the illustrated embodiment each of the electrodes extends in the z direction above and below the scan plane (the plane of the paper). A slot-shaped opening (narrow in z and wide in y) in the electrodes allows the scanned beam to pass through the four electrodes. The electrodes 61–64 are symmetric about a beam centerline 48. The lens structure of FIG. 2 includes a first gap 44 for decelerating ions and a second gap 46 for accelerating the ions. The combined action of the electric fields set up by the four electrodes causes ions entering the lens structure 40 to exit the lens structure so that all trajectories are generally parallel to the central axis 48.

The lens structure 40' of FIG. 3 includes first and second voltage gap 44', 46' spaced apart along a direction of ion movement. Each gap extends on opposite sides of a beam path across a width of the ion beam for deflecting ions entering the lens structure. The lens structure of FIG. 3 includes a first gap 44' for accelerating ions and a second gap 46' for decelerating the ions. In this embodiment the grounded electrode of the gap 44' is past by ions in the beam after they encounter the energized electrode so that there is a component of the positive electric field (for accelerating ions) in the positive 'x' direction. The combined action of the electric fields set up by the two gaps causes ions entering the lens structure 40 to exit the lens structure approximately parallel to the central ray, 48 if the incident trajectories originate at the approximate location of the scan vertex.

Subsequent to leaving the lens structures 40, 40' of FIGS. 2 and 3, the ions that make up the beam are moving in generally parallel directions and enter an ion implantation chamber 50. Enclosed within the ion implantation chamber 50 is a wafer support 52. Wafers are inserted into the chamber 52 by means of a load lock 54. Outside the chamber 50 the wafers are manipulated by a robot 56 which extracts untreated wafers from a storage cassette 58 and returns treated wafers to a second cassette 60 or alternatively can return the treated wafers from the same cassette from which they were withdrawn.

In the embodiment of FIG. 2, the first electrode or entrance electrode creates a first region of an electric field for ions entering the lens structure. The entrance electrode is concave as seen from a region of ions entering the lens. The second electrode or exit electrode creates a second electric field for ions that have passed through the entrance electrode. The exit electrode is convex as seen from a region of bounded by the entrance electrode.

The lens structure 40 changes the angle at which the ions leave the structure without changing the beam energy. Each of the electrodes 62, 63 is coupled to a common power supply 110 having an output coupled to conductors 112, 114 that pass through insulators 116, 118 that support the electrodes 62, 63 relative to the beam and are coupled to the electrodes 62, 63 for electrically energizing the electrodes. The lens structure 40 is capable of correcting scan angles of scanned 600 keV beams with application of d.c. signals from the power supply of less than 150 kV. In the illustrated embodiment of the invention, a distance from the center of the scanning structure to the first or entrance electrode is approximately 97 cm. The shape of the two gaps 44, 46 is roughly parabolic and approximates the shape of two thin lenses of 2*S focal length, where S is the distance to the scan vertex, 97 cm for the first electrode 62 in this example. The ideal shape of the decelerating and accelerating gaps formed by the electrodes 61, 62 and 63, 64 is subject to electrostatic modeling of fields and trajectories, to achieve the best correction of beam direction. The spacing along the beam centerline is approximately 5 cm separation of electrodes in each gap and with approximately 10 cm between electrodes 62 and 63 at the centerline.

A lens electrode voltage of 117 kV is suitable for a 600 keV beam. For the deceleration gap, $E_p = E_{in} - R*E_{in}$, where $E_p$ is the energy between gaps and $R*E_{in}$ is the energy change after passing through the gap, $R=0.195=117/600$ in this example. For the accelerating gap, $E_{in} = E_p + R*E_{in}$. The path length through the lens structure from a point co-incident with a leading edge of the electrode 61 to the trailing edge of the electrode 64 varies from between 25 and 43 centimeters depending on the 'y' position of the ion within the beam. The vertical opening in the z direction formed by the electrodes is approximately 5 cm. A suppressor, (not shown), is needed on the entrance and output of scan plates and lens structure to keep positive potentials applied to these devices from extracting electrons from the ion beam, which would lead to increased space charge effects.

In the embodiment of FIG. 3, the first electrode or entrance electrode 62 in combination with the grounded electrode 61 creates a first region of electric field for ions entering the lens structure. The entrance electrode is convex as seen from a region of ions entering the lens. The second electrode 63 or exit electrode creates a second region of electric field for ions that have passed through the entrance electrode. The exit electrode is concave as seen from a region of bounded by the entrance electrode.

It should be noted that it is possible to use two or more assemblies such as FIG. 1 or 2 in series to achieve angle correction with smaller corrections occurring at each gap (with a smaller voltage on the gap), thereby achieving parallel trajectories for higher energy beams with modest voltages on the lens structure.

Figure 4:
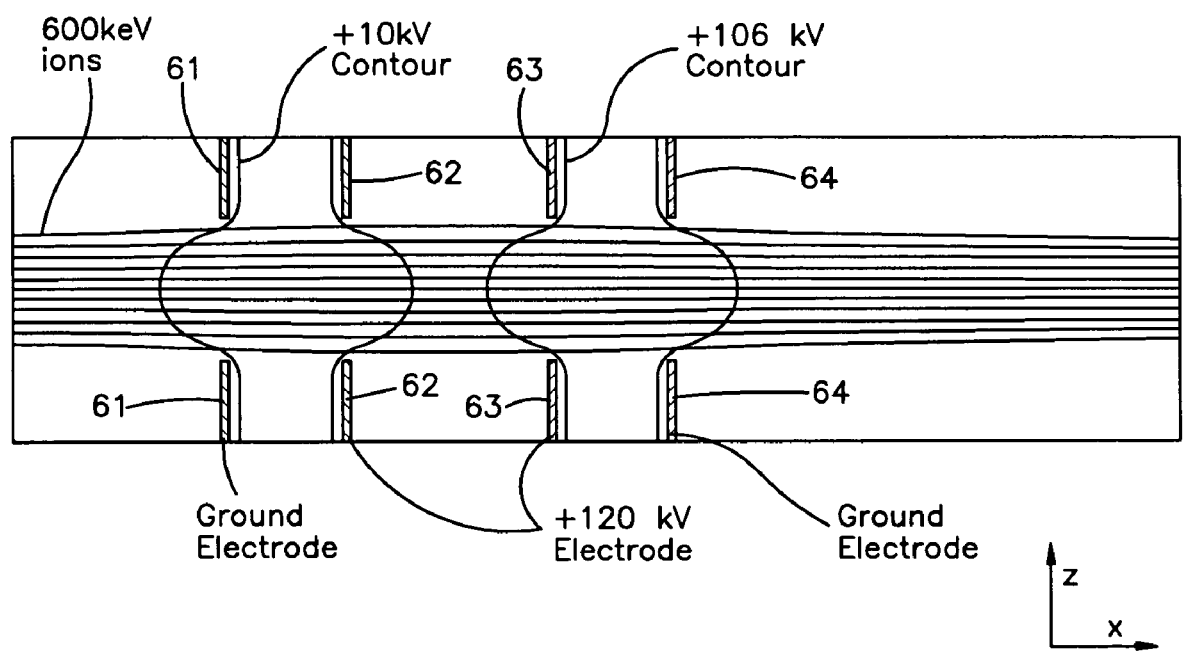
FIG. 4 is a section view of the lens structure of FIG. 2 showing a vertical focusing effect of the lens structure.

It should also be noted as the ion beam passes through these electrodes it will experience focusing in the plane orthogonal to the scan plane due to the fringe fields of the electrodes. See FIG. 4. The focal length is determined by the voltage on the gap relative to the beam energy, the height of the opening (in z), and the width of the gap (along the direction of travel, x). Electrostatic modeling of the structure can be used to achieve vertical focusing that is approximately the same at all positions y after the lens. It should also be noted that the vertical focusing will occur for gaps in which electrodes 61, 62 and 63, 64 are substantially parallel to each other. This would produce a lens which has vertical focusing for a scanned beam or a ribbon beam.

Each of the two alternate embodiments has been depicted with two energized electrodes and two grounded electrodes that are positioned along the beam path of travel to form an accelerating and a decelerating gap through which ions pass. It is also possible to use more electrodes at lower voltages to create more than two gaps. Thus, for example the structure could be implemented by an electrode of lower voltage that defines an accelerating gap followed immediately along the beam path by an electrode that defines a decelerating gap followed by a second accelerating gap and then a second decelerating gap that are implemented with appropriate electrodes of a similar parabolic shape.

Figure 5:
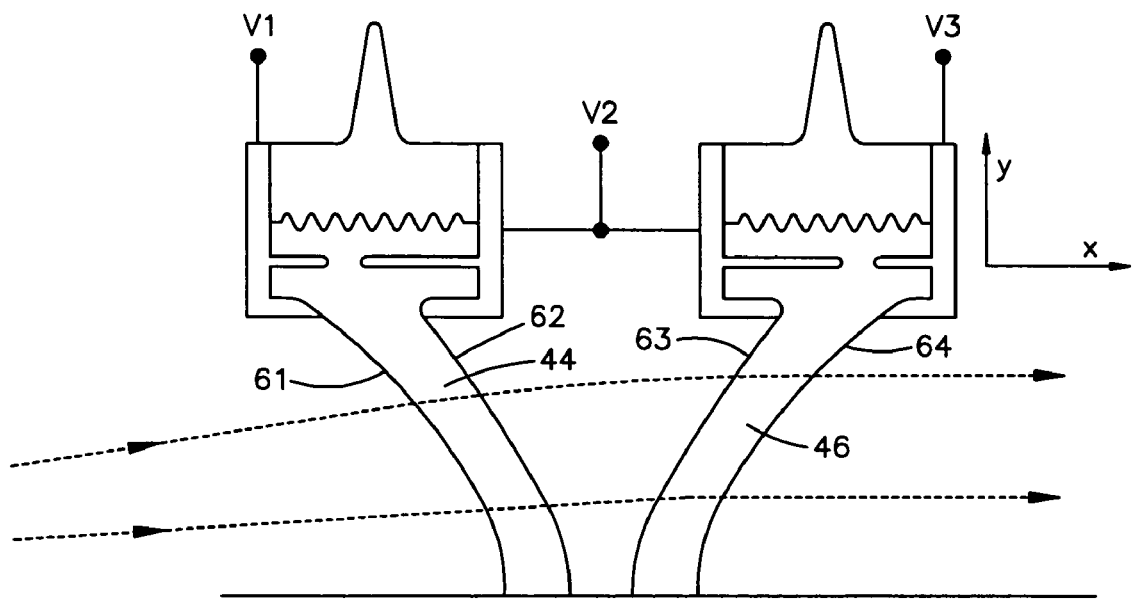
FIG. 5 is a section view of the lens structure of FIG. 2 showing an alternative embodiment of the lens structure of FIG. 2 that includes independent voltage sources.
Figure 6:
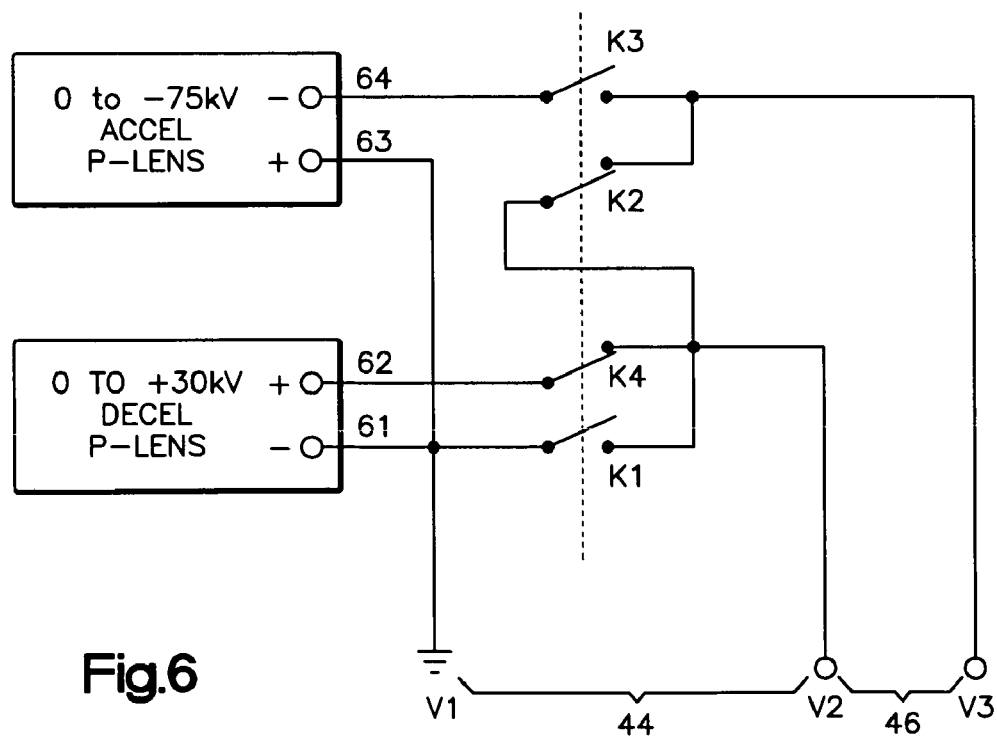
FIG. 6 is a schematic diagram of a voltage control circuit for the lens structure of FIG. 5.

Another embodiment of this invention is achieved by including a lens structure mode controller (shown schematically in FIG. 6) that controls the bias voltages to be applied to each of the two voltage gaps as shown in FIG. 5 such that only one gap is active at any given time. In one configuration, the beam angles can be changed from the scanned angle to a direction parallel to the beam axis 48 either by decelerating in the first gap 44 or by accelerating in the second gap 46. Only one gap has voltage across it at any given time and the other gap is shorted by operating a set of ganged relay connections outlined in FIG. 6. If the lens will be operated in this single gap mode, the electrode shape would be designed to achieve parallelism in one gap instead of two. If the lens is to be operated in an alternative mode, such as accelerating rather than decelerating, the electrode would be changed to a shape appropriate for the energy change that is required by the alternative configuration. Power supplies and relays located within a terminal at potential V1 that enable this mode of operation are shown in FIG. 6.

The single gap embodiment allows the use of the acceleration gap for higher energy beams where it is beneficial to gain energy as scan angles are compensated. In the alternative, the deceleration gap can be used for beams of lower final energy. In FIG. 1, for example, the acceleration gap might increase the energy of the beam from the ion source 12 by a factor of 2.7, resulting in an energy of about 110 keV after the lens 40. Additional voltage gaps after the lens would allow the beam energy to be raised to higher levels if desired.

Present implanters that have only an acceleration lens require large deceleration ratios after the lens 40 to reach the final energy for low energy implants, less than about 5 keV. Deceleration gaps that have the requisite large deceleration ratios often have strong focusing properties and magnify small angles of divergence that make it hard to transport beams at the lowest energies. Using the deceleration portion of lens 40 to focus the beam rather than an acceleration lens reduces the energy of the beam while compensating for the scan angles. For example, a deceleration lens can be used that reduces the energy from the ion source by a factor of 3, leading to an energy after the lens of 15 keV or less. Additional deceleration gaps after the lens could then achieve very low energies with a smaller deceleration ratio and focusing properties that are easier to control.

Referring to FIG. 5, the relative bias voltages on the various electrodes are shown in table 1 below for deceleration and acceleration modes. In deceleration mode, contacts K2 and K4 are closed as shown in FIG. 6. As shown in this example, this causes V1 to be ground and V2=V3=+30 kV. Therefore, the lead electrode 61 of the deceleration gap 44 is at ground and the second electrode (as well as both of the electrodes 63, 64 of the acceleration gap 46) is at a higher voltage, +30 kV in this example. A positive ion beam enters the lens at energy $E_{in}$ from a region at potential V1. Since the gap 44 has voltage V2−V1 across it with V2>V1, the positive ions are slowed down by a factor $E_{out}=C1*E_{in}$, (where C1 may be about ⅓ for a specific lens shape). In addition to the deceleration of the ions, all ion trajectories are made parallel to the beam axis after passing through this gap. In this case there is no voltage drop across the acceleration gap 46 because both electrodes 63, 64 are at the same potential.

In acceleration mode, the contacts in FIG. 6 are switched to a position opposite that shown in FIG. 6 by virtue of a ganged connection shown schematically as the hashed line intersecting all of the contacts. K1 and K3 are closed and K2 and K4 are open. This switch combination makes V1=V2 and V3 is −75 kV. Both electrodes 61 and 62 of the deceleration gap 44 are at V1. The lead electrode 63 of the acceleration gap 46 is also at V1. The second electrode in the accelerating gap 64 is at a lower voltage, −75 kV in this example. A positive ion beam enters the lens at energy $E_{in}$ from a region at potential V1 and no voltage drop occurs across gap 44. Since gap 46 has voltage V3−V2 where V2=V1 and V3<V1, the positive ions gain energy by a factor $E_{out}=C2*E_{in}$, (where C2 may be about 2.7 for a specific lens shape). In addition to the acceleration of the ions, all ion trajectories are made parallel to the beam axis after passing through this gap.

| Mode | Gap status | Relative Voltages |
| --- | --- | --- |
| Deceleration | 44- live, 46 shorted | V2 > V1, V2 = V3 |
| Acceleration | 46- live, 44 shorted | V3 < V1, V1 = V2 |

Another embodiment, not shown, would allow the two separate power supplies to be connected in a similar way to the alternative lens configuration shown in FIG. 3 to allow activation of only the acceleration gap or deceleration gap to provide scan angle compensation as in the example described above for FIG. 5.

The description above concerns the use of a series of "slit lenses" (lenses formed by electrostatic voltage gaps shaped by curved planes with slit openings for the ion beam to pass through) to focus ions, which have been scanned in one plane, to form parallel rays after the lens. In this case, the lens focuses the object (scan vertex) to infinity in the plane of the slit. A more general use of this concept utilizes a lens that focuses the object and image to a finite distance. This lens configuration focuses beams, which have an envelope that is wide in one plane and relatively narrow in the orthogonal plane. Such a slit lens lets the beam maintain a ribbon-like shape while being focused as required to pass through subsequent beamline apertures.

It is the intent that although several exemplary embodiments of the invention have been described with a degree of particularity, the invention includes all modifications and alterations from the disclosed exemplary design falling within the spirit or scope of the appended claims.

The invention claimed is:

1. Ion implantation apparatus comprising:
    an ion source that emits ions generated from a source material;
    a mass discriminating magnet that bends ions away from a trajectory along a path of ion travel downstream from the ion source;
    an ion scanner positioned to intercept ions subsequent to the mass discriminating magnet to scan ions from side to side in a controlled manner to form an ion beam having a width;
    a lens structure which defines a region into which the ions pass that deflects ions away from an initial trajectory downstream from the scanner as they enter the lens structure; said lens structure including a lens electrode pair that either accelerates or decelerates said ions; wherein the electrodes in said lens electrode pair are spaced apart along a direction of ion movement which extends across a width of the ion beam to deflect ions entering the lens structure; and
    a lens structure mode controller that switches a biasing voltage that is applied to the lens structure between a voltage that tends to accelerate the ions and a voltage that tends to decelerate the ions to cause ions entering the lens structure to exit said lens structure with a desired exit trajectory.

2. The apparatus of claim 1 wherein the ion scanner comprises a scanning electrode.

3. The apparatus of claim 1 wherein the ion scanner comprises a magnetic scanner.

4. The apparatus of claim 1 wherein the lens structure comprises two lens electrode pairs, one of which is an accelerating lens electrode pair and the other of which is a decelerating lens electrode pair.

5. The apparatus of claim 4 wherein the controller activates a single lens electrode pair by connecting one of the electrodes in the activated lens electrode pair to a first biasing voltage and connecting the other one of the electrodes in the activated lens electrode pair and both of the electrodes from the other electrode pair to a second biasing voltage.

6. The apparatus of claim 4 wherein the controller comprises a plurality of relays that selectively connect each of the electrodes in the accelerating and decelerating lens electrode pairs to bias voltages supplied by one or more power supplies.

7. The apparatus of claim 4 wherein the controller activates both lens electrode pairs such that the ion acceleration caused by the acceleration lens electrode pair is reduced by an ion deceleration caused by the deceleration electrode pair.

8. The apparatus of claim 4 wherein the decelerating lens electrode pair comprises an entrance electrode for creating a first region of electric field for ions entering the lens structure and wherein the entrance electrode is concave as seen from a region of ions entering the lens and further wherein accelerating lens electrode comprises an exit electrode for creating a second region of electric field for ions that have passed through the entrance electrode and wherein the exit electrode is convex as seen from a region of bounded by the entrance electrode.

9. The apparatus of claim 4 wherein a first lens electrode pair encountered by ions moving along an ion beam path is an accelerating electrode lens pair and a second lens electrode pair encountered by the ions is a decelerating electrode lens pair.

10. The apparatus of claim 4 wherein a first lens electrode pair encountered by ions moving along an ion beam path is a decelerating electrode lens pair and a second lens electrode pair encountered by the ions is an accelerating electrode lens pair.

11. The apparatus of claim 1 wherein the desired trajectory is such that all ions exit the lens structure in a beam path in which the ions travel parallel to one another.

12. The apparatus of claim 1 wherein the desired trajectory is such that all ions exit the lens structure in a beam path that will converge in a finite distance.

13. For use with an ion implanter having ion beam that is deflected from side to side before treating a workpiece, a lens structure which defines a region into which the ions pass for deflecting ions away from an initial trajectory as they enter the lens structure; said lens structure including a first energized electrode pair having electrodes spaced apart along a direction of ion movement which extends across a width of the ion beam for deflecting ions entering the lens structure, and a lens structure mode controller that switches a biasing voltage that is applied to the lens structure between a voltage that tends to accelerate the ions and a voltage that tends to decelerate the ions to cause ions entering the lens structure to exit said lens structure with a desired exit trajectory regardless of the trajectory ions enter the lens structure.

14. The apparatus of claim 13 wherein the lens structure comprises two lens electrode pairs, one of which is an accelerating lens electrode pair and the other of which is a decelerating lens electrode pair.

15. The apparatus of claim 13 wherein the controller activates a single lens electrode pair by connecting one of the electrodes in the activated lens electrode pair to a first biasing voltage and connecting the other one of the electrodes in the activated lens electrode pair and both of the electrodes from the other electrode pair to a second biasing voltage.

16. The apparatus of claim 13 wherein the controller comprises a plurality of relays that selectively connect each of the electrodes in the accelerating and decelerating lens electrode pairs to bias voltages supplied by one or more power supplies.

17. A process for forming an ion beam for use with an ion implanter, comprising:
    accelerating ions created from a source material to create an ion beam;

scanning ions in said beam from side to side in a controlled manner to form a thin ion beam having a width; and deflecting ions that make up the thin ion beam away from an initial trajectory as they enter a deflection region by selectively energizing a lens structure that includes a pair of electrodes positioned in spaced apart relation along a direction of ion movement to form a lens thereby creating an electric field to deflect ions entering the deflection region; and switching the bias voltage applied to said lens structure to select between a biasing voltage that creates a field that tends to accelerate the ions and a biasing voltage that creates a field that tends to decelerate the ions to cause ions entering the deflection region to exit said deflection region with approximately the same exit trajectory regardless of the initial trajectory the ions enter the deflection region.

18. The process of claim 17 wherein the electrodes in the electrode pair are curved in a direction across the width of the thin beam to create a non-uniform electric field across the width of said beam.

19. The process of claim 17 comprising positioning a second electrode pair along the ion beam path such that one of the first or second electrode pairs is an accelerating electrode pair that accelerates the ions and the other of the first or second electrode pairs is a decelerating electrode pair that decelerates the ions and switching the biasing voltage to activate one of the first or second electrode pairs and deactivate the other electrode pair.

20. The process of claim 19 wherein the biasing voltage is switched by connecting one of the electrodes in the activated lens electrode pair to a first biasing voltage and connecting the other one of the electrodes in the activated lens electrode pair and both of the electrodes from the other electrode pair to a second biasing voltage.

21. Ion implantation apparatus comprising:
an ion source for emitting ions generated from a source material;
a mass discriminating magnet for bending ions away from a trajectory along a path of ion travel downstream from the ion source;
an ion scanner positioned to intercept ions subsequent to the mass discriminating magnet to scan ions from side to side in a controlled manner to form an ion beam having a width; and
a lens structure which defines a region into which the ions pass for deflecting ions away from an initial trajectory downstream from the scanning electrode as they enter the lens structure; said lens structure including first and second electrodes spaced apart along a direction of ion movement which extends on opposite sides of a beam path across a width of the ion beam for deflecting ions entering the lens structure; said lens structure including one electrode for accelerating ions and one electrode for decelerating said ions to cause ions entering the lens structure to exit said lens structure with a controlled exit trajectory.

22. The Apparatus of claim 21 additionally comprising a power supply for applying a static voltage to each of the first and second electrodes.

23. The apparatus of claim 22 wherein the power supply supplies the same voltage to each electrode.

24. The apparatus of claim 21 wherein the first electrode comprises an entrance electrode for creating a first region of electric field for ions entering the lens structure and wherein the entrance electrode is concave as seen from a region of ions entering the lens and further wherein said second electrode comprises an exit electrode for creating a second region of electric field for ions that have passed through the entrance electrode and wherein the exit electrode is convex as seen from a region of bounded by the entrance electrode.

25. The apparatus of claim 21 wherein the first electrode comprises an entrance electrode for creating a first region of electric field for ions entering the lens structure and wherein the entrance electrode is convex as seen from a region of ions entering the lens and further wherein said second electrode comprises an exit electrode for creating a second region of electric field for ions that have passed through the entrance electrode and wherein the exit electrode is concave as seen from a region of bounded by the entrance electrode.

26. The apparatus of claim 21 wherein a first electrode encountered by ions moving along an ion beam path is an accelerating electrode and a second electrode encountered by the ions is a decelerating electrode.

27. The apparatus of claim 21 wherein a first electrode encountered by ions moving along an ion beam path is an decelerating electrode and a second electrode encountered by the ions is a accelerating electrode.

28. The apparatus of claim 21 wherein the first and second electrodes are positioned in relation to first and second fixed, lower potential electrodes spaced from the first electrode and the second electrode to create first and second electric field defining gaps through which the ions move.

29. The apparatus of claim 21 wherein the ion scanner comprises a scanning electrode.

30. The apparatus of claim 21 wherein the ion scanner comprises a magnetic scanner.

31. The apparatus of claim 21 wherein the controlled trajectory is such that all ions exit the lens structure in a beam path in which the ions travel parallel to one another.

32. The apparatus of claim 21 wherein the controlled trajectory is such that all ions exit the lens structure in a beam path that will converge in a finite distance.

* * * * *